United States Patent

Briere

(10) Patent No.: US 9,159,679 B2
(45) Date of Patent: Oct. 13, 2015

(54) SEMICONDUCTOR PACKAGE WITH INTEGRATED PASSIVES AND METHOD FOR FABRICATING SAME

(75) Inventor: Michael A. Briere, Woonsocket, RI (US)

(73) Assignee: International Rectifier Corporation, El Segundo, CA (US)

( * ) Notice: Subject to any disclaimer, the term of this patent is extended or adjusted under 35 U.S.C. 154(b) by 590 days.

(21) Appl. No.: 12/584,420

(22) Filed: Sep. 3, 2009

(65) Prior Publication Data

US 2010/0065856 A1  Mar. 18, 2010

Related U.S. Application Data

(60) Provisional application No. 61/097,116, filed on Sep. 15, 2008.

(51) Int. Cl.
*H01L 23/64* (2006.01)
*H01L 23/522* (2006.01)

(52) U.S. Cl.
CPC .......... *H01L 23/642* (2013.01); *H01L 23/5223* (2013.01); *H01L 23/5227* (2013.01); *H01L 23/645* (2013.01); *H01L 2924/0002* (2013.01)

(58) Field of Classification Search
CPC .............. H01L 2924/3025; H01L 2924/3011; H01L 23/645; H01L 23/5227; H01L 2924/19042; H01L 2924/30107
USPC .............. 257/99, 700, 76–347, 434; 438/210
See application file for complete search history.

(56) References Cited

U.S. PATENT DOCUMENTS

| | | | |
|---|---|---|---|
| 6,410,960 B1 * | 6/2002 | Arai et al. ...................... | 257/347 |
| 6,617,681 B1 * | 9/2003 | Bohr .............................. | 257/700 |
| 2002/0048668 A1 * | 4/2002 | Inoue ............................. | 428/210 |
| 2005/0116803 A1 * | 6/2005 | Choi et al. ..................... | 336/223 |
| 2006/0175627 A1 * | 8/2006 | Shiraishi ......................... | 257/99 |
| 2008/0001241 A1 * | 1/2008 | Tuckerman et al. ........... | 257/434 |
| 2008/0136390 A1 | 6/2008 | Briere | |

* cited by examiner

Primary Examiner — Eugene Lee
Assistant Examiner — Fang-Xing Jiang
(74) Attorney, Agent, or Firm — Farjami & Farjami LLP

(57) ABSTRACT

According to one disclosed embodiment, a semiconductor package for integrated passives and a semiconductor device comprises a high permeability structure formed over a surface of the semiconductor package and surrounding a contact body of the semiconductor package, the contact body being connected to an output of the semiconductor device. The contact body can be, for example, a solder bump. The high permeability structure causes a substantial increase in inductance of the contact body so as to form an increased inductance inductor coupled to the output of the semiconductor device. In one embodiment, the semiconductor package further comprises a blanket insulator formed over the high permeability structure, and a capacitor stack formed over the blanket insulator. In one embodiment, the semiconductor device comprises a group III-V power semiconductor device.

13 Claims, 4 Drawing Sheets

SEMICONDUCTOR PACKAGE WITH INTEGRATED PASSIVES AND METHOD FOR FABRICATING SAME

The present application claims the benefit of and priority to a pending provisional patent application entitled "Integrated III-Nitride Half Bridge with Integrated Passive," Ser. No. 61/097,116 filed on Sep. 15, 2008. The disclosure in that pending provisional application is hereby incorporated fully by reference into the present application. The present application is related to U.S. Patent Application Publication Number 2008/0136390 by Applicant, whose disclosure is hereby also incorporated fully by reference into the present application.

BACKGROUND OF THE INVENTION

1. Definition

In the present application, "group III-V semiconductor" refers to a compound semiconductor that includes at least one group III element and at least one group V element, such as, but not limited to, gallium nitride (GaN), gallium arsenide (GaAs), indium aluminum gallium nitride (InAlGaN), indium gallium nitride (InGaN) and the like. Analogously, "III-nitride semiconductor" refers to a compound semiconductor that includes nitrogen and at least one group III element, such as, but not limited to, GaN, AlGaN, InN, AlN, InGaN, InAlGaN and the like.

2. Field of the Invention

The present invention is generally in the field of semiconductors. More specifically, the present invention is in the field of semiconductor packaging.

3. Background Art

Semiconductor device fabrication has consistently moved in the direction of smaller dimensions, more densely spaced layouts, and faster device operation, and that trend promises to continue. One obstacle to the achievement of optimum design efficiency has been the need to accommodate passive devices, such as resistors, and/or capacitors, and/or inductors, as accompaniments to the active semiconductor devices in a particular circuit.

Unfortunately, the conventional approach to implementing passive devices in integrated circuits typically consumes valuable space, increases component count, and introduces undesirable parasitics. For example, when implemented on-chip, the die space occupied by passives reduces the space available for active devices, or causes package size to increase undesirably. Even when implemented off-chip, passives may occupy circuit board space that could otherwise be more efficiently utilized. Moreover, the additional parasitics introduced by the traces needed to electrically connect off-chip passives to the active devices on-chip can negatively effect circuit performance. Also, increased component count, due to adding passives as separate components off-chip, increases cost and reduces manufacturing throughput.

Thus, there is a need to overcome the drawbacks and deficiencies in the art by providing a solution enabling integration of one or more passive devices utilized in combination with an active semiconductor device.

SUMMARY OF THE INVENTION

A semiconductor package with integrated passives and method for fabricating same, substantially as shown in and/or described in connection with at least one of the figures, as set forth more completely in the claims.

DETAILED DESCRIPTION OF THE INVENTION

Figure 1:
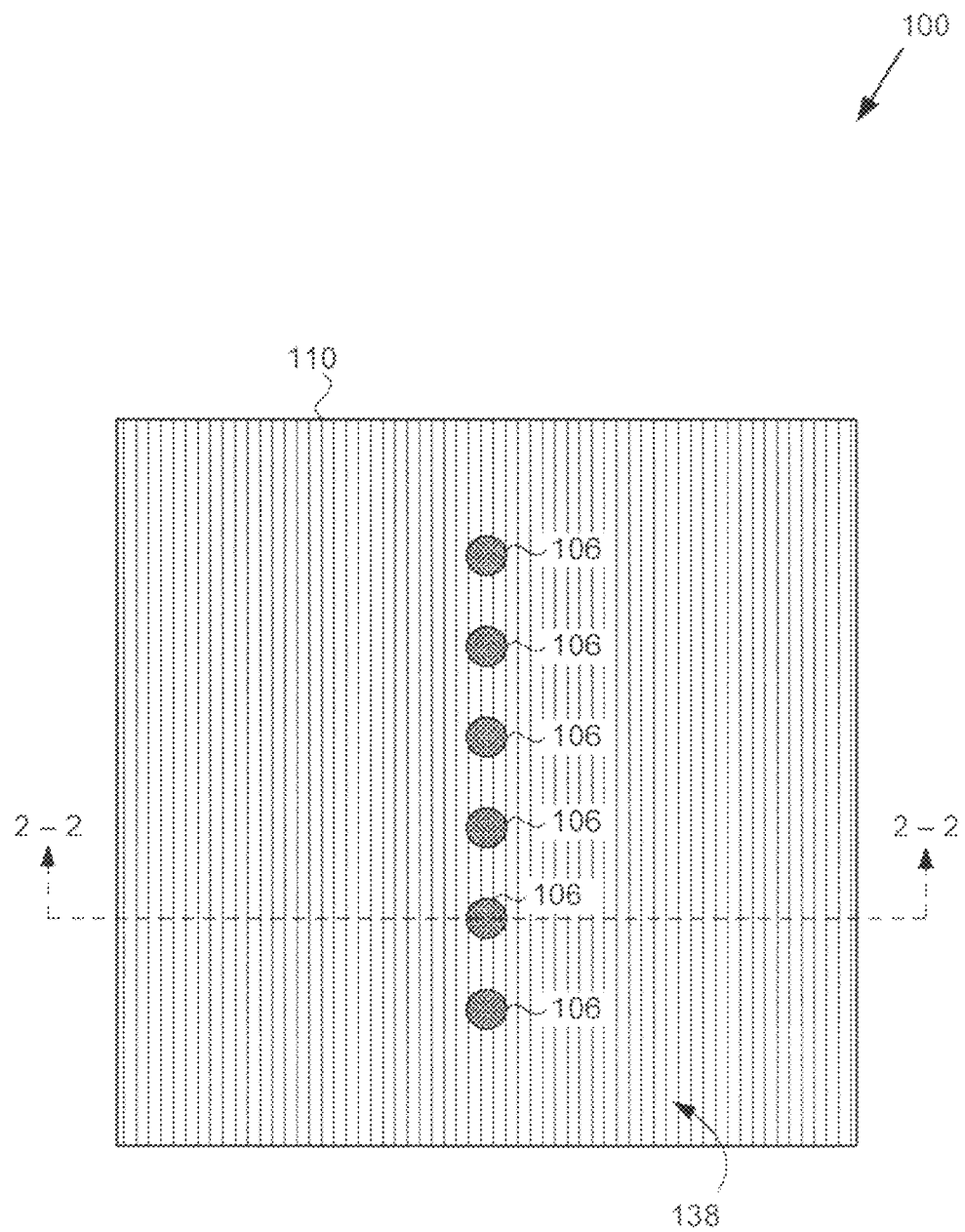
FIG. 1 is a block diagram showing a top view of a semiconductor package with integrated passives, according to one embodiment of the present invention.

The present invention is directed to a semiconductor package with integrated passives and method for fabricating same. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals.

FIG. 1 is a block diagram showing a top view of a semiconductor package with integrated passives, according to one embodiment of the present invention. It is noted that perspective 100, in FIG. 1, shows a specific implementation of the present inventive concepts. It should be noted that particular details such as the specific features shown in FIG. 1 and the remaining Figures, the semiconductor device(s) represented therein, the techniques used to provide electrical coupling shown in FIG. 1 and the remaining Figures, and the overall functionality of the semiconductor device represented by the drawings, are provided as examples only, and should not be interpreted as limitations. In addition, it is noted that the present drawings, including FIG. 1, are not drawn to scale, so that some of the features shown may be depicted as either larger or smaller relative to other features than would typically be the case in practice.

Perspective 100 provides a top view of semiconductor package 110, which may correspond to a flip chip package, for example. Perspective 100 shows top surface 138 of a capacitor stack formed over semiconductor package 110 (see, top surface 238 of capacitor stack 230 shown in cross section in FIG. 2). Also shown by perspective 100 are a plurality of "contact bodies" 106 for providing electrical coupling to an output of a semiconductor device housed by semiconductor package 110, such as a group III-V power semiconductor device, for example. Although the arrangement shown by perspective 100 represents contact bodies 106 as multiple solder bumps, in other embodiments contact bodies 106 may be implemented using any suitable conductive structures, such as solder balls, solder bars, and/or contact metal studs extending into semiconductor package 110, for example. Moreover, although the embodiment of FIG. 1 indicates that electrical coupling to an output of the semiconductor device housed by semiconductor package 110 is provided by plurality of contact bodies 106, which may be electrically tied together, for example, in other embodiments, a single contact body might be implemented to provided the described output coupling.

According to one embodiment of the present invention, perspective 100 may be seen to correspond to a top view of semiconductor package 110 designed to house a buck converter integrated power stage, for example. Such a device might be implemented using, for example, a pair of group III-V field-effect transistors (FETs) or group III-V high electron mobility transistors (HEMTs), arranged in a half-bridge configuration including a control transistor and a synchronous ("synch") transistor. More generally, it is contemplated that semiconductor package 110 be configured to house a device comprising an integrated power converter as described in U.S. Patent Application Publication Number 2008/0136390 by Applicant, whose disclosure is hereby incorporated fully by reference into the present application.

Figure 2:
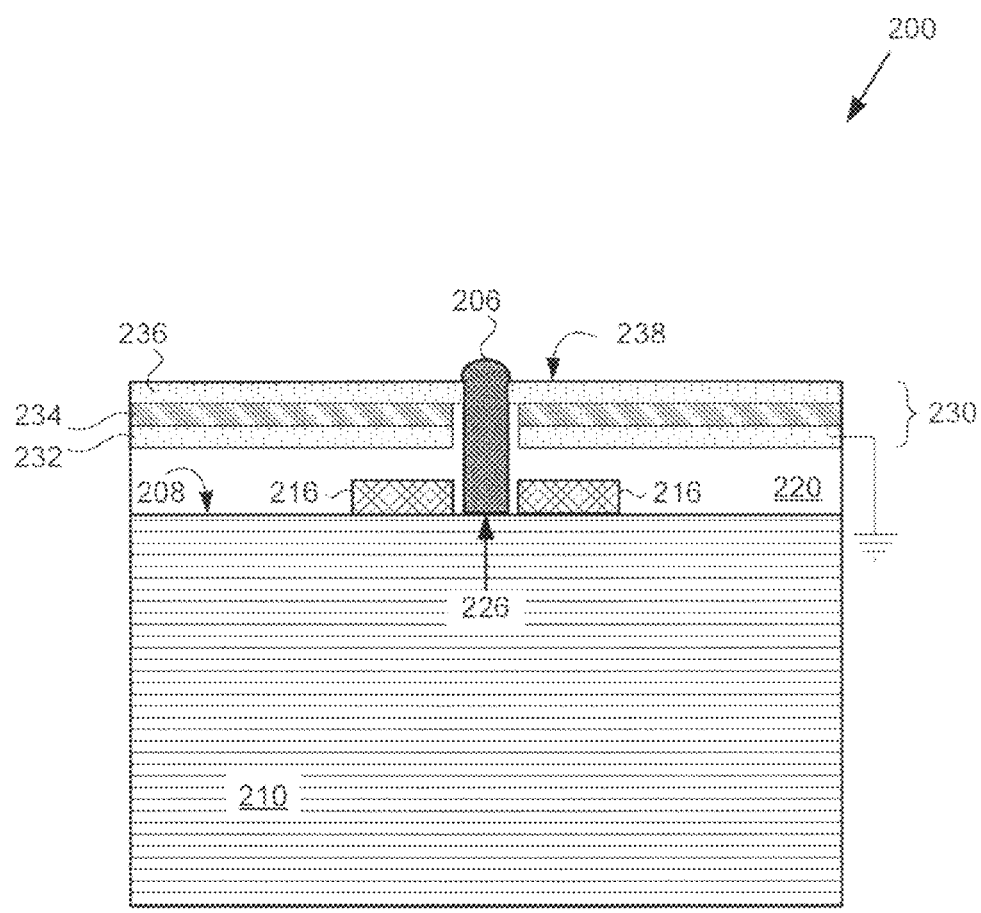
FIG. 2 is a block diagram showing a cross-sectional view of the semiconductor package of FIG. 1 along line 2-2, according to one embodiment of the present invention.

Turning now to FIG. 2, FIG. 2 is a block diagram showing a cross-sectional view of the semiconductor package with integrated passives of FIG. 1, along line 2-2 in that figure, according to one embodiment of the present invention. Perspective 200, in FIG. 2, shows semiconductor package 210 and contact body 206. Semiconductor package 210 and contact body 206 correspond respectively to semiconductor package 110 and one of contact bodies 106, in FIG. 1.

Also shown in FIG. 2 are high permeability structure 216 formed over a portion of semiconductor package surface 208 and surrounding contact body 206, blanket insulator 220 formed over surface 208 and high permeability structure 216, and capacitor stack 230 formed over blanket insulator 220. Capacitor stack 230, which was referred to but not shown in conjunction with FIG. 1, includes lower capacitor plate 232, capacitor dielectric 234, and upper capacitor plate 236. Top surface 238 of capacitor stack 230, in FIG. 2, corresponds to top surface 138 in FIG. 1. FIG. 2 further shows location 226, representing electrical connection of contact body 206 to an output of the semiconductor device housed by semiconductor package 210. For example, in the previously described embodiment in which semiconductor package 210 houses a buck converter integrated power stage, location 226 may correspond to connection of contact body 206 to a switch node of the buck converter.

According to the embodiment of FIG. 2, contact body 206 extends beyond a top surface of high permeability structure 216 as well as beyond top surface 238 of capacitor stack 230. High permeability structure 216 may be formed to a thickness of from approximately one hundred (100) micrometers (um) to approximately three hundred (300) um, for example, and may comprise any material having a high degree of magnetization in response to a magnetic field. For instance, high permeability structure 216 may comprise cobalt phosphide (CoP), manganese zinc (MnZn), or any of a variety of ferrite materials. According to the embodiment of FIG. 2, high permeability structure 216 is spaced apart from contact body 206 by a gap filled by blanket insulator 220. In other embodiments, however, high permeability structure 216 may by in direct contact with contact body 206.

The presence of high permeability structure 216 over a portion of semiconductor package surface 208 surrounding contact body 206 causes a substantial increase in inductance of contact body 206, so as to form an increased inductance inductor coupled to the output of the semiconductor device housed by semiconductor package 210, at location 226. At switching speeds of from approximately fifty (50) to one hundred (100) MHz, for example, high permeability structure 216 may be configured to generate an inductance on the order of one or more nanoHenrys (nH), which can be an effective output inductance for the semiconductor device in semiconductor package 210. Thus, as shown in FIG. 2, high permeability structure 216 may be implemented to serve as a passive device, e.g. inductor, integrated with semiconductor package 210, and configured for use with the semiconductor device housed by semiconductor package 210.

In addition to the integrated inductor represented by high permeability structure 216, the embodiment of FIG. 2 also integrates a second passive device, in this instance a capacitor, with semiconductor package 210. Output capacitance for the semiconductor device housed by semiconductor package 210 is provided by capacitor stack 230. According to the embodiment of FIG. 2, capacitor stack 230 surrounds contact body 206 and is electrically isolated from high permeability structure 216 by blanket insulator 220, over which capacitor stack 230 is formed. As shown in FIG. 2, capacitor stack 230 may include lower capacitor plate 232 and upper capacitor plate 236, which may be formed from any suitable conductive materials, such as aluminum or copper, for example. It is noted that lower capacitor plate 232 and upper capacitor plate 236 may, but need not, comprise the same conductive material. In addition, capacitor stack 230 includes capacitor dielectric 234, which may be a high-κ dielectric such as hafnium oxide ($HfO_2$), strontium titanate ($SrTiO_3$), or titanium oxide ($TiO_2$), for example.

In the embodiment of FIG. 2, contact body 206 is electrically isolated from lower capacitor plate 232, which is shown to be grounded, but is electrically connected to upper capacitor plate 236 and extends beyond top surface 238 of capacitor stack 230. Although not shown in FIG. 2, grounding of lower capacitor plate 232 may be achieved internally through the device housed in semiconductor package 210. For example, where the housed semiconductor device comprises a buck converter integrated power stage, lower capacitor plate 232 may be coupled to the source of a buck converter synch transistor (shown, for example, as node 405 in the circuit diagram of FIG. 4) housed in semiconductor package 210.

When implemented together, as shown in FIG. 2, high permeability structure 216 and capacitor stack 230 may be configured to provide an output filter for the semiconductor device housed in semiconductor package 210. However, in other embodiments, either of the integrated passive devices represented in FIG. 2, e.g., the inductor corresponding to high permeability structure 216, or the capacitor corresponding to capacitor stack 230, may be implemented alone. In still other embodiments, either or both integrated passives shown in FIG. 2 may be implemented in combination with one or more additional integrated passive devices.

Figure 3:
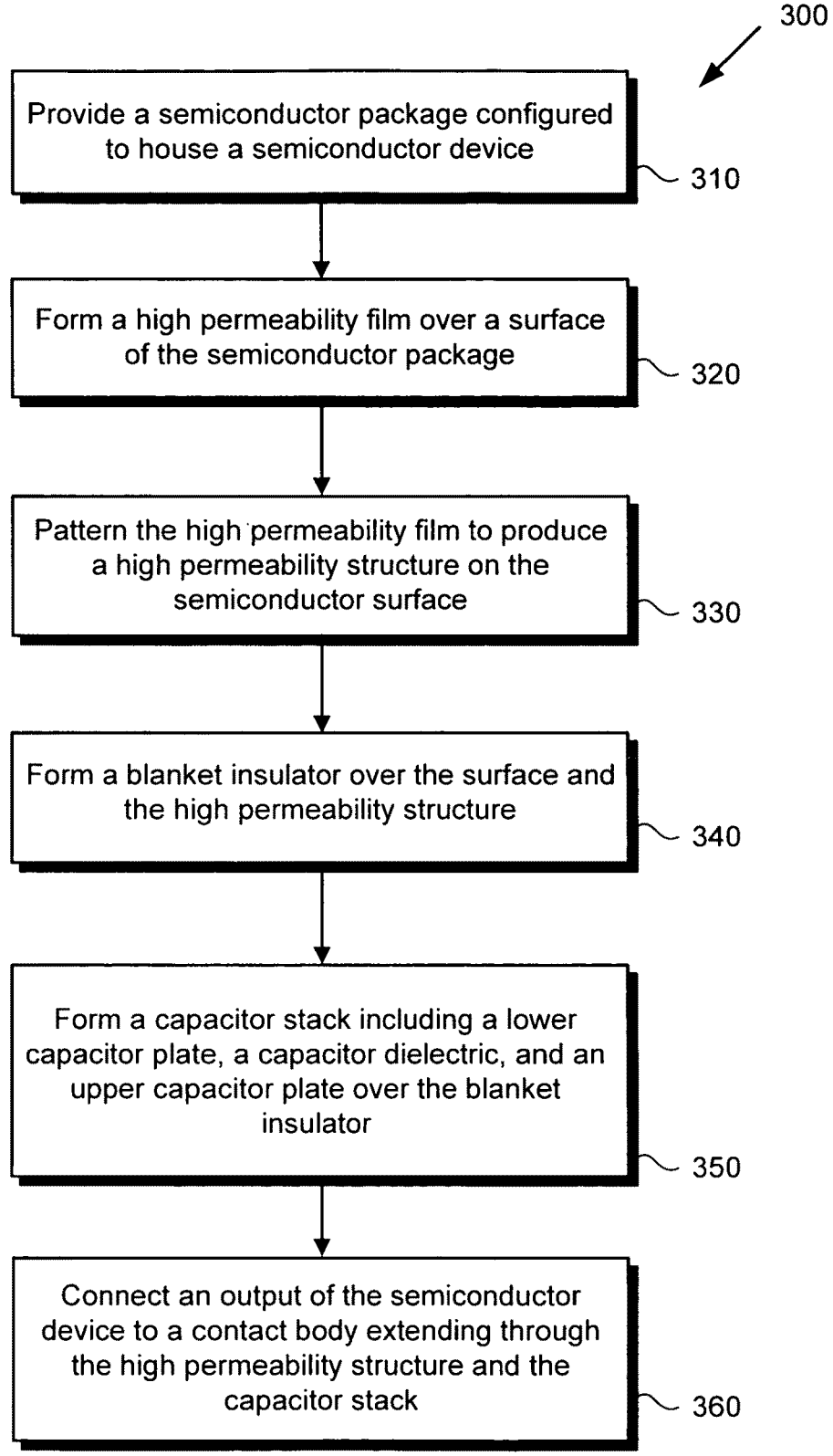
FIG. 3 shows a flowchart presenting a method for fabricating a semiconductor package with integrated passives, according to one embodiment of the present invention.

Continuing to FIG. 3, FIG. 3 shows flowchart 300 presenting a method for fabricating a semiconductor package with integrated passives, according to one embodiment of the present invention. It is noted that certain details and features have been left out of flowchart 300 that are apparent to a person of ordinary skill in the art. For example, a step may comprise one or more substeps or may involve specialized equipment or materials, as known in the art. While steps 310 through 360 indicated in flowchart 300 are sufficient to describe one embodiment of the present invention, other embodiments of the invention may utilize steps different from those shown in flowchart 300 and may include more, or fewer, steps.

Beginning with step 310 of flowchart 300 and referring to FIG. 1, step 310 of flowchart 300 comprises providing semiconductor package 110 configured to house a semiconductor device. As previously explained by reference to FIG. 1, in one embodiment, semiconductor package 110 may correspond to a flip chip package configured to house a group III-V power semiconductor device, such as a III-nitride buck converter integrated power stage implemented using GaN FETs, for example.

Moving to step 320 of flowchart 300, step 320 in FIG. 3 comprises forming a high permeability film over a portion of surface 208. The high permeability film formed in step 320 may be deposited to a thickness of from approximately one hundred (100) um to approximately three hundred (300) um, for example, and may comprise any material having a high degree of magnetization in response to a magnetic field. For instance, the high permeability film may comprise cobalt phosphide (CoP), manganese zinc (MnZn), or any of a variety of ferrite materials.

Proceeding to step 330 of flowchart 300 and referring to FIG. 2, step 330 comprises patterning the high permeability film formed in step 320 to produce high permeability structure 216 on semiconductor package surface 208. Patterning of the high permeability film in step 330 may be performed by any suitable technique, as known in the art.

Continuing with step 340 of flowchart 300 and continuing to refer to FIG. 2, step 340 comprises forming blanket insulator 220 over semiconductor package surface 208 and high permeability structure 216. Blanket insulator 220 may comprise any suitable insulating material, such as silicon dioxide ($SiO_2$) or silicon nitride ($Si_3N_4$), for example. In the embodiment of FIG. 2, for example, forming blanket insulator 220, in step 340, enables integration of multiple passives with semiconductor package 210 by providing electrical isolation between high permeability structure 216 and the additional passives. As a result, the method of flowchart 300 can continue in step 350 through formation of capacitor stack 230 including lower capacitor plate 232, capacitor dielectric 234, and upper capacitor plate 236 over blanket insulator 220.

Moving on to step 360 in FIG. 3, step 360 of flowchart 300 comprises connecting an output of the semiconductor device, shown by location 226, to at least one contact body 206 extending from location 226 through high permeability structure 216 and capacitor stack 230. Although the present embodiment characterizes the semiconductor device housed by semiconductor package 210 as connecting to solder bump 206 at output location 226, more generally, step 360 may be performed using any suitable contact body, such as a solder ball, contact bar, or metal stud, for example.

As previously described by reference to FIG. 2, high permeability structure 216 surrounds contact body 206 situated at surface 208 of semiconductor package 210 at its interface with surface 208. Consequently, high permeability structure 216 surrounding contact body 206 at surface 208 causes a substantial increase in inductance of contact body 206 so as to form an increased inductance inductor coupled to the output of the semiconductor device housed in semiconductor package 210, at location 226.

Figure 4:
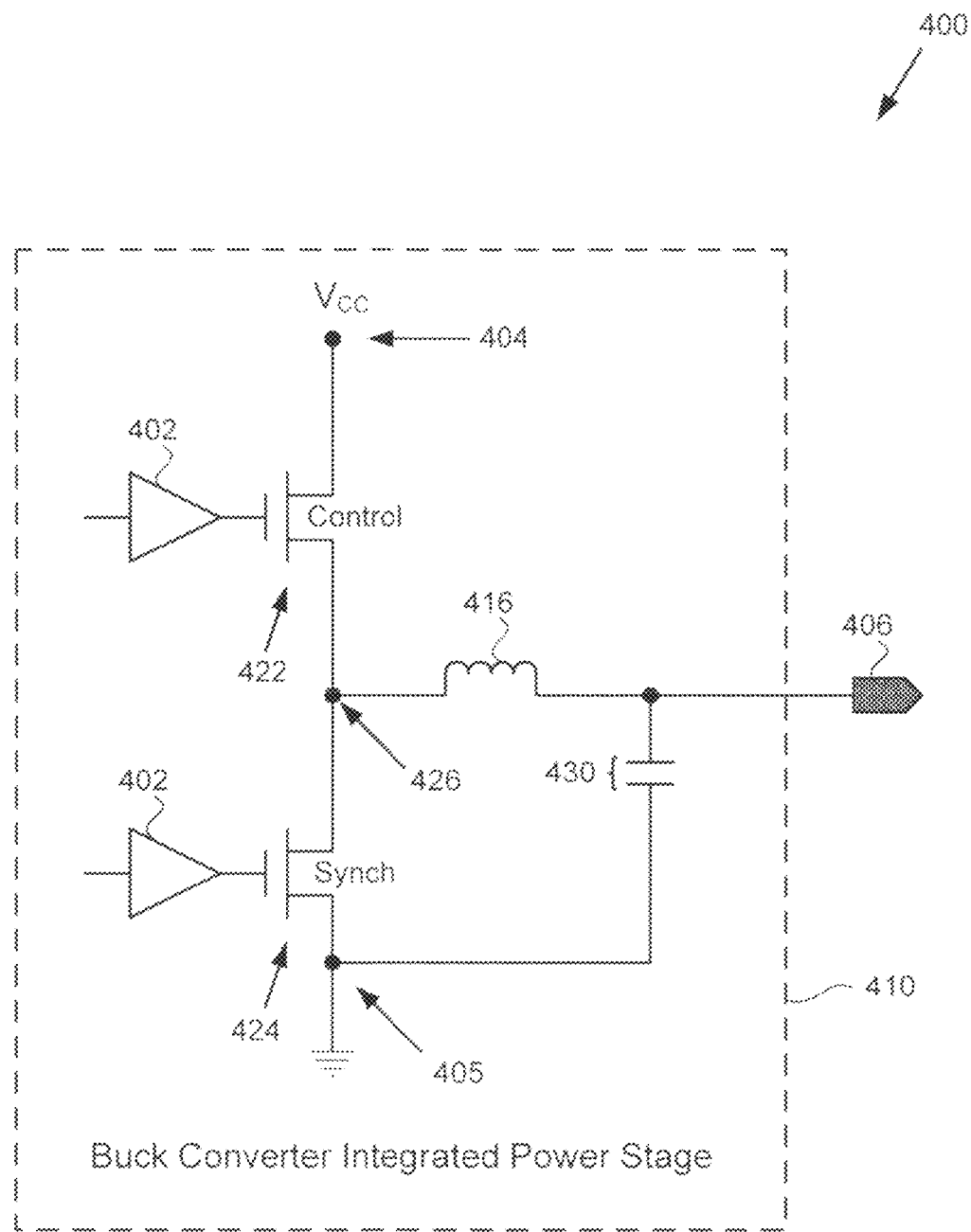
FIG. 4 is a block diagram showing an exemplary circuit for illustrating an exemplary operation of a semiconductor package with integrated passives and active semiconductor devices, according to one embodiment of the present invention.

FIG. 4 is a block diagram showing an exemplary circuit corresponding to the operation of a semiconductor package with integrated passives and a semiconductor device, according to one embodiment of the present invention. Circuit 400, in FIG. 4, may be seen to correspond to the operation of the exemplary buck converter integrated power stage arrangement described in conjunction with FIGS. 1 and 2. Circuit 400, in FIG. 4, is shown to be surrounded by semiconductor package 410 and includes drive circuitry for a buck converter, as represented by amplifiers 402, and circuit output 406. Semiconductor package 410 corresponds to semiconductor package 210, in FIG. 2, described there as capable of housing a buck converter integrated power stage, while circuit output 406 corresponds to contact body 206, in FIG. 2. It is noted that although the present discussion characterizes circuit 400 as a buck converter type circuit, other variations of the present embodiment can be adapted for any desired type of buck or boost DC to DC converter type circuit, or any type of AC to DC or DC to AC converters, or in general any other circuit utilizing passive components, such as analog circuits or mixed signal circuits.

Continuing with the buck converter integrated power stage embodiment represented by FIG. 4, circuit 400 includes FET's 422 and 424 coupled in a half-bridge configuration. FET's 422 and 424 may be group III-V semiconductor devices, such as GaN based HEMTs, for example, and may be implemented as depletion mode devices or as enhancement mode devices. As shown in FIG. 4, FET 422, which is series connected between $V_{CC}$ node 404 and switching node 426 of the half-bridge configuration, is the control transistor. FET 424, which is series connected between switching node 426 and ground node 405, is the synch transistor.

Switching node 426, in FIG. 4, corresponds to location 226 indicating the output connection to the semiconductor device housed by semiconductor package 210, in FIG. 2. As shown in FIG. 4, inductor 416 is coupled between switching node 426 and circuit output 406, and capacitor 430 couples circuit output 406 to ground. Comparison of FIG. 4 and FIG. 2 reveals that inductor 416 corresponds to the result of contact body 206 extending through high permeability structure 216, capacitor 430 corresponds to capacitor stack 230, and circuit output 406 corresponds to contact body 206 in the respective figures.

Thus, as shown by the embodiments of FIGS. 1 and 4, the present invention enables, among other things, integration of the passives corresponding to inductor 416 and capacitor 430 with the packaging used to house control FET 422, synch FET 424, and drive circuitry 402, thereby both reducing the footprint of the exemplary buck converter integrated power stage circuit 400 and avoiding the parasitics introduced when wire bond or conductive traces are used as electrical coupling means. Moreover, because the disclosed inventive concepts may be applied to integrate a wide variety of packaged semiconductor devices and the passive components with which they are implemented, the present invention provides a general packaging solution offering the above advantages across a broad spectrum of device types.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A semiconductor package housing a semiconductor device, said semiconductor package comprising:

a contact body connected to an output of said semiconductor device in said semiconductor package;

said semiconductor package having a high permeability structure formed over a portion of a surface thereof, said high permeability structure situated over said semiconductor device and surrounding said contact body;

said semiconductor package having a blanket insulator formed over and surrounding said high permeability structure at said surface;

said high permeability structure causing a substantial increase in inductance of said contact body so as to form an increased induction inductor over said surface, coupled to said output of said semiconductor device.

2. The semiconductor package of claim 1, wherein said contact body extends beyond a top surface of said high permeability structure.

3. The semiconductor package of claim 1, wherein a capacitor stack is formed over said blanket insulator.

4. The semiconductor package of claim 3, wherein said contact body extends beyond a top surface of said capacitor stack.

5. The semiconductor package of claim 3, wherein said high permeability structure and said capacitor stack provide an output filter for said semiconductor device.

6. The semiconductor package of claim 1, wherein said contact body is one of a solder bump, a solder ball, a contact bar, and a metal stud.

7. The semiconductor package of claim 1, wherein said semiconductor device comprises a group III-V power semiconductor device.

8. The semiconductor package of claim 1, wherein said semiconductor device comprises at least one gallium nitride (GaN) field-effect transistor (FET).

9. A semiconductor package housing a buck converter including a control transistor and a synch transistor, said semiconductor package comprising:

a contact body connected to a switch node of said buck converter housed in said semiconductor package;

said semiconductor package having a high permeability structure formed over a portion of a surface thereof, said high permeability structure situated over said buck converter and surrounding said contact body;

said semiconductor package having a blanket insulator formed over and surrounding said high permeability structure at said surface;

said high permeability structure causing a substantial increase in inductance of said contact body so as to form an increased induction inductor over said surface, coupled to said switch node of said buck converter.

10. The semiconductor package of claim 9, wherein said control transistor and said synch transistor are gallium nitride (GaN) field-effect transistors (FETs).

11. The semiconductor package of claim 9, wherein said high permeability structure is formed from a high permeability film selected from the group consisting of cobalt phosphide (CoP) and manganese zinc (MnZn).

12. The semiconductor package of claim 9, wherein a capacitor stack is formed over said blanket insulator.

13. The semiconductor package of claim 12, wherein said high permeability structure and said capacitor stack provide an output filter for said buck converter.

* * * * *